US012550290B2

(12) United States Patent
Chen et al.

(10) Patent No.: US 12,550,290 B2
(45) Date of Patent: Feb. 10, 2026

(54) COLD PLATE WITH STREAMLINED COOLANT TUBES

(71) Applicant: Quanta Computer Inc., Taoyuan (TW)

(72) Inventors: Chao-Jung Chen, Taoyuan (TW); Yu-Nien Huang, Taoyuan (TW); Yu-Yi Hsieh, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 203 days.

(21) Appl. No.: 18/513,242

(22) Filed: Nov. 17, 2023

(65) Prior Publication Data

US 2025/0126745 A1 Apr. 17, 2025

Related U.S. Application Data

(60) Provisional application No. 63/589,870, filed on Oct. 12, 2023.

(51) Int. Cl.
*H05K 7/20* (2006.01)

(52) U.S. Cl.
CPC ..... *H05K 7/20254* (2013.01); *H05K 7/20272* (2013.01); *H05K 7/20772* (2013.01)

(58) Field of Classification Search
CPC ........... H05K 7/20254; H05K 7/20272; H05K 7/20772; H05K 7/20327; H05K 7/20345; H05K 7/20809; H05K 7/20854; H05K 7/20927; H05K 7/20936; H05K 7/20981; H05K 7/2099
See application file for complete search history.

(56) References Cited

U.S. PATENT DOCUMENTS

| | | | |
|---|---|---|---|
| 9,398,722 B1 | 7/2016 | Sykes et al. | |
| 2005/0205236 A1 | 9/2005 | Kalbacher et al. | |
| 2007/0144715 A1 | 6/2007 | Ohashi | |
| 2009/0134005 A1 | 5/2009 | Sato et al. | |
| 2014/0158324 A1* | 6/2014 | Tochiyama | H01L 23/473 165/67 |
| 2016/0153595 A1* | 6/2016 | Arvelo | F15D 1/00 285/332 |

(Continued)

FOREIGN PATENT DOCUMENTS

| | | |
|---|---|---|
| CN | 110081743 A | 8/2019 |
| CN | 114963840 A | 8/2022 |

OTHER PUBLICATIONS

Wang CN 114963840 A Translation.*

(Continued)

*Primary Examiner* — Jacob R Crum
(74) *Attorney, Agent, or Firm* — NIXON PEABODY LLP

(57) ABSTRACT

A cold plate for cooling a heat-generating component in a computer system is disclosed. The cold plate includes a base member having an exterior surface for contact with the heat-generating component. The cold plate has a supply chamber defined by a supply end, and an opposite collection chamber defined by a collection end. A supply tube includes an inlet having a cross section area that is smaller than the cross section area of an outlet. The outlet is in communication with the supply chamber. A collection tube includes an inlet having a cross section area that is larger than the cross section area of an outlet. The inlet is in fluid communication with the collection chamber.

16 Claims, 6 Drawing Sheets

(56) References Cited

U.S. PATENT DOCUMENTS

2018/0269131 A1* 9/2018 Na ..................... H05K 7/20263
2020/0321266 A1 10/2020 Kato et al.
2021/0092879 A1* 3/2021 Chen .................. H05K 7/20272

OTHER PUBLICATIONS

TW Office Action for Application No. 113110939 mailed Nov. 18, 2024, w/ First Office Action Summary, 9 pp.
TW Search Report for Application No. 113110939 mailed Nov. 18, 2024, w/ First Office Action, 1 p.

* cited by examiner

COLD PLATE WITH STREAMLINED COOLANT TUBES

CROSS-REFERENCE TO RELATED APPLICATIONS

This application claims priority from and benefit of U.S. Provisional Patent Application Ser. No. 63/589,870, filed on Oct. 12, 2023, which is hereby incorporated by reference herein in its entirety.

TECHNICAL FIELD

The present invention relates generally to liquid cooling systems, and more specifically, to a cold plate having streamlined coolant tubes to allow efficient coolant flow.

BACKGROUND

Electronic components, such as servers, include numerous electronic components that are powered by a common power supply. Servers generate an enormous amount of heat due to the operation of internal electronic devices such as controllers, processors, and memory. Overheating from the inefficient removal of such heat has the potential to shut down or impede the operation of such devices. Thus, current servers are designed to rely on air flow through the interior of the server to carry away heat generated from electronic components. Servers often include various heat sinks that are attached to the electronic components such as processing units. Heat sinks absorb the heat from the electronic components, thus transferring the heat away from the components. The heat from heat sinks must be vented away from the server. Air flow to vent away such heat is often generated by a fan system.

Due to the improvement of high-performance systems, the amount of heat that needs to be removed becomes higher with each new generation of electronic components. With the advent of more powerful components, traditional air cooling in combination with fan systems is inadequate to sufficiently remove heat generated by newer generation components. The development of liquid cooling has been spurred by the need for increased cooling. Liquid cooling is the currently accepted solution for rapid heat removal due to the superior thermal performance from liquid cooling. At room temperature, the heat transfer coefficient of air is only 0.024 W/mK, while a coolant, such as water, has a heat transfer coefficient of 0.58 W/mK, which is 24 times than that of air. Thus, liquid cooling is more effective in transporting heat away from a heat source to a radiator, and allows heat removal from critical parts without noise pollution.

In rack level liquid cooling system designs, the cooling liquid source includes a closed loop cooling system and an open loop cooling system to facilitate heat exchange. Known closed loop liquid cooling systems use heat exchange to cool hot water which is heated from a heat source such as a server. Heat is then removed from the hot water in the closed loop liquid cooling system via an open loop system such as a radiator in proximity to a fan wall. The closed loop cooling system includes the heat source and a heat exchanger. A liquid flow pipe carries coolant liquid to the heat source. Heat generated by the heat source is transferred to the coolant liquid. A liquid flow pipe carries heated liquid away from the heat source.

The rack holds a series of servers. Within each of the servers, an inlet tube carries coolant liquid to a cold plate that is attached over a heat-generating electrical component, such as a processor chip. The cold plate has a network of internal conduits or channels that circulate the coolant internally in the cold plate. Each processor in a server may have a dedicated cold plate or share a cold plate with another processor. Heat generated by the processor is transferred to the cold plate and is in turn transferred to the coolant liquid circulating through the cold plate. An outlet tube carries heated liquid away from the cold plate.

FIG. 1A shows a perspective view of a known cold plate 10 that uses coolant to cool chips with high power. The cold plate 10 includes a rectangular base member 20 having a top surface 22 and a bottom plate 24. The top surface 22 includes an inlet manifold 26 and an outlet manifold 28. The inlet manifold 26 supports an inlet connector assembly 30. The outlet manifold 28 supports an outlet connector assembly 32. The inlet connector assembly 30 may be connected to a tube to supply coolant to the cold plate 10 via an inlet 34. The inlet 34 is attached to a coupler 36 that may be attached to a supply tube for receiving coolant. The heated coolant from the cold plate 10 is collected at the outlet connector assembly 32 and recirculated through an outlet 38 that is attached to a coupler 40. The other end of the coupler 40 may be attached to a collector tube that carries away the heated coolant.

FIG. 1B shows a cutaway side view of the cold plate 10 along the line 1B-1B' in FIG. 1A. FIG. 1C shows a lateral cutaway side view of the cold plate 10 along the line 1C-1C' in FIG. 1A. FIG. 1D shows a cutaway side view of the cold plate 10 along the line 1D-1D' in FIG. 1A.

As shown in FIG. 1B, the coolant enters the inlet connector assembly 30 from the coupler 36 and inlet 34. The flow direction of the coolant from the inlet 34 passes through one end of a 90-degree bend tube 42 that directs the coolant to a conduit 44 formed in the inlet manifold 26. The conduit 44 to supplies coolant to an interior inlet chamber 50 of the base member 20 of the cold plate 10. The interior inlet chamber 50 includes a series of parallel fins 52 that form channels for coolant flow. The 90-degree bend tube 42 in the inlet connector assembly 30 causes a pressure drop of the coolant and thus reduces the velocity of the coolant through the interior inlet chamber 50 of the base member 20.

The parallel fins 52 channel the coolant across the bottom plate 24 of the base member 20. The coolant thus absorbs heat from a processor that may be located under the base member 20 and in thermal communication with the bottom plate 24. The heated coolant circulates to the other side of the base member 20 to an interior outlet chamber 54 as shown in FIGS. 1C and 1D.

As shown in FIGS. 1C and 1D, the coolant is collected after flowing through the parallel fins 52 to the interior outlet chamber 54. Due to the pressure of the coolant, the coolant is driven up a conduit 60 through the outlet manifold 28. The coolant is forced in a flow direction that passes through one end of a 90-degree bend tube 62 to the outlet 38 through the coupler 40. The 90-degree bend tube 62 at the outlet connector assembly 32 causes another pressure drop in the coolant.

In such liquid cooling systems, the efficiency of cooling correlated with the pressure of the coolant through the cold plate. This in turn, results in more efficient power usage of the processor. Based on this, to reducing system pressure drop is the most important factor to efficient cooling.

Thus, there is a need for a cold plate design that allows for streamlined coolant flow while minimizing pressure loss in the coolant. There is a further need for a cold plate that may provide efficient cooling of heat-generating components through efficient coolant flow.

SUMMARY

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, an example cold plate for cooling a heat-generating component is disclosed. The cold plate includes a base member having an exterior surface for contact with the heat-generating component. The cold plate has a supply chamber defined by a supply end, and an opposite collection chamber defined by a collection end. A supply tube includes an inlet having a cross section area that is smaller than the cross section area of an outlet. The outlet is in communication with the supply chamber. A collection tube includes an inlet having a cross section area that is larger than the cross section area of an outlet. The inlet is in fluid communication with the collection chamber.

A further implementation of the example cold plate is where the base member includes coolant channels defined by fins between the supply chamber and collection chamber. Another implementation is where the supply tube includes a curved section that directs fluid flow 180 degrees between the inlet and the outlet. Another implementation is where the collection tube includes a curved surface that is an angle relative to the inlet. Another implementation is where the base member is fabricated from one of a group of copper, copper alloy, stainless steel, and aluminum alloy. Another implementation is where the collection tube and the supply tube are fabricated from stainless steel. Another implementation is where the width of the inlet of the collection tube and the outlet of the supply tube are the width of the ends of the base member.

According to certain aspects of the present disclosure, an example computer system is disclosed. The computer system includes a heat-generating computer component, a hot coolant connector and a cold coolant connector. The computer system includes a cold plate that has a base member having an exterior surface in contact with the heat-generating component. The base member has a supply chamber defined by a supply end, and an opposite collection chamber defined by a collection end. A supply tube includes an inlet having a cross section area that is smaller than the cross section area of an outlet. The inlet is in fluid communication with the cold coolant connector and the outlet is in fluid communication with the supply chamber. A collection tube includes an inlet having a cross section area that is larger than the cross section area of an outlet. The inlet is in fluid communication with the collection chamber and the outlet is in fluid communication with the hot coolant connector.

A further implementation of the example computer system is where the base member includes coolant channels defined by fins between the supply chamber and collection chamber. Another implementation is where the supply tube includes a curved section that directs fluid flow 180 degrees between the inlet and the outlet. Another implementation is where the collection tube includes a curved surface that is an angle relative to the inlet. Another implementation is where the base member is fabricated from one of a group of copper, copper alloy, stainless steel, and aluminum alloy. Another implementation is where the collection tube and the supply tube are fabricated from stainless steel. Another implementation is where the width of the inlet of the collection tube and the outlet of the supply tube are the width of the ends of the base member. Another implementation is where the example computer system includes a supply hose having a circular cross section coupled to the cold coolant connector. A first coupler has an inlet with a circular cross section coupled to the supply hose and an outlet having a rectangular cross section coupled to the inlet of the supply tube. A collection hose has a circular cross section coupled to the hot coolant connector. A second coupler has an outlet with a circular cross section coupled to the collection hose and an inlet having a rectangular cross section coupled to the outlet of the collection tube. Another implementation is where the heat-generating computer component is a processor chip.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
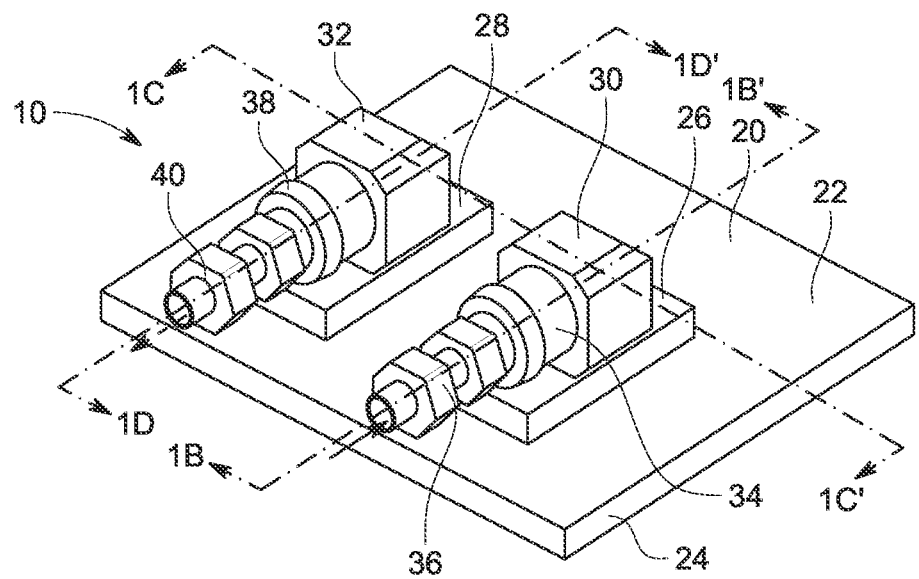
FIG. 1A is a perspective view of a prior art cold plate showing coolant inlets and outlets.
Figure 1B:
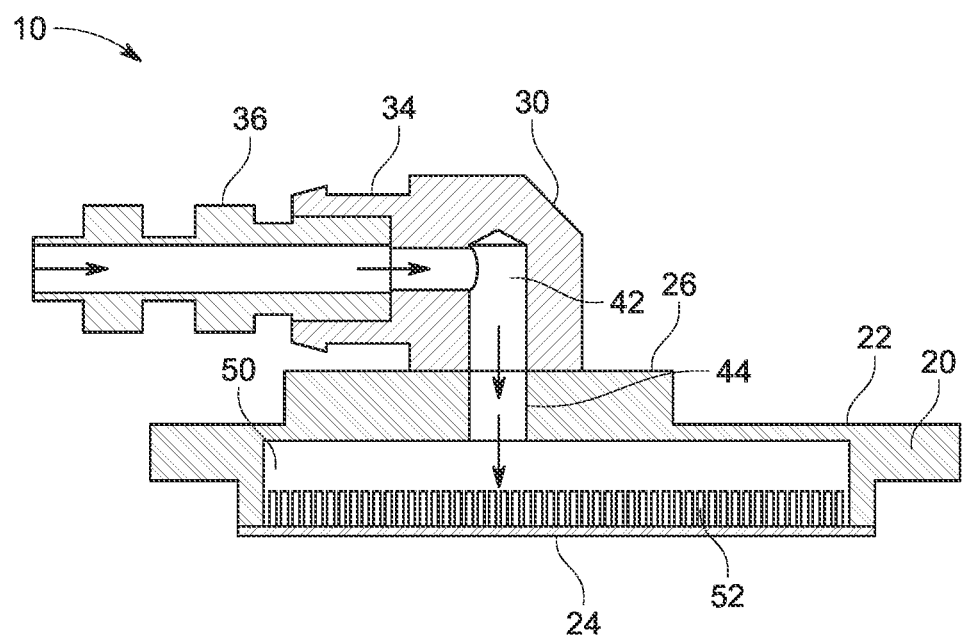
FIG. 1B is a cross section cutaway view of the prior art cold plate in FIG. 1A.
Figure 1C:
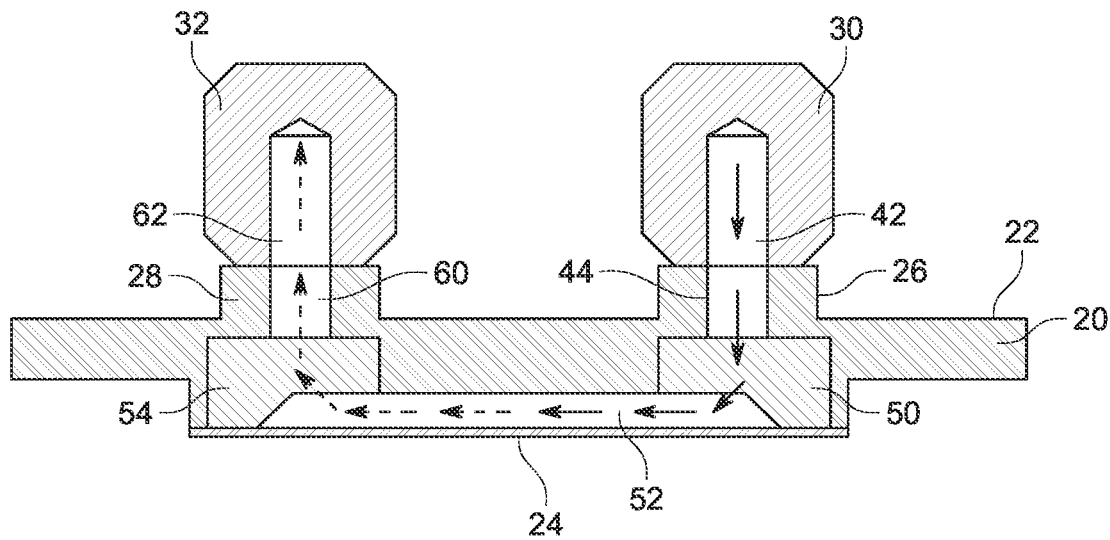
FIG. 1C is a cross section cutaway lateral view of the base member of the prior art cold plate in FIG. 1A showing coolant flow.
Figure 1D:
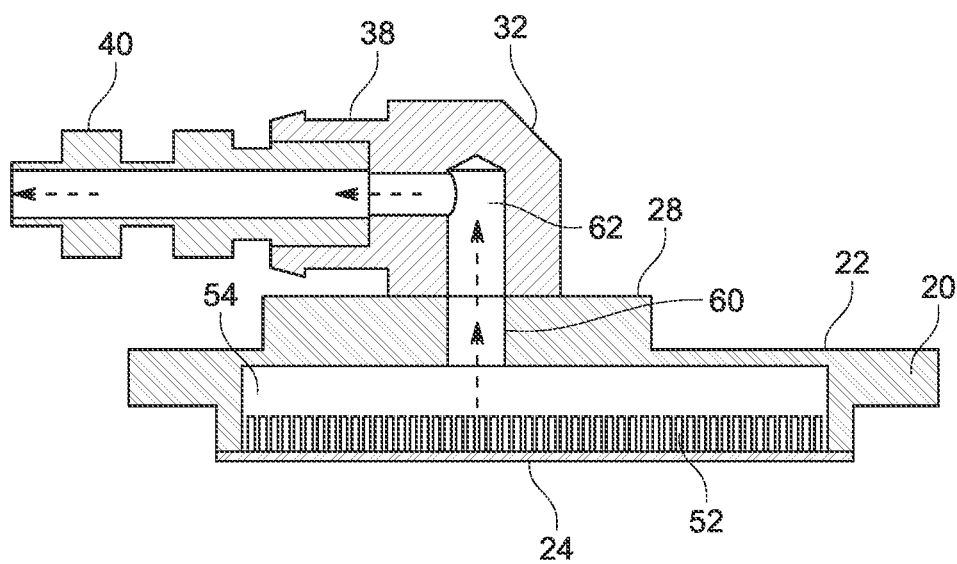
FIG. 1D is a cross section cutaway view of coolant flow in a part of the prior art cold plate in FIG. 1A.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

The present disclosure relates to a cold plate having that has streamlined inlet and outlet tubes that replace the known 90 degree bend tubes used with cold plates. The example streamlined inlet and outlet tubes serve to reduce pressure drops in coolant flow to and from the cold plate. The design of the streamlined inlet and outlet tubes optimize coolant flow and thus increase the cooling capability of the cold plate. The streamlined inlet and outlet tube designs have a shape that provides a gradual increase in the cross section from one end of the tube to the other end of the tube. The resulting entire flow path has a fluent streamlined shape that avoids sharp bends. This reduces pressure drops in the coolant flow through the cold plate.

Figure 2:
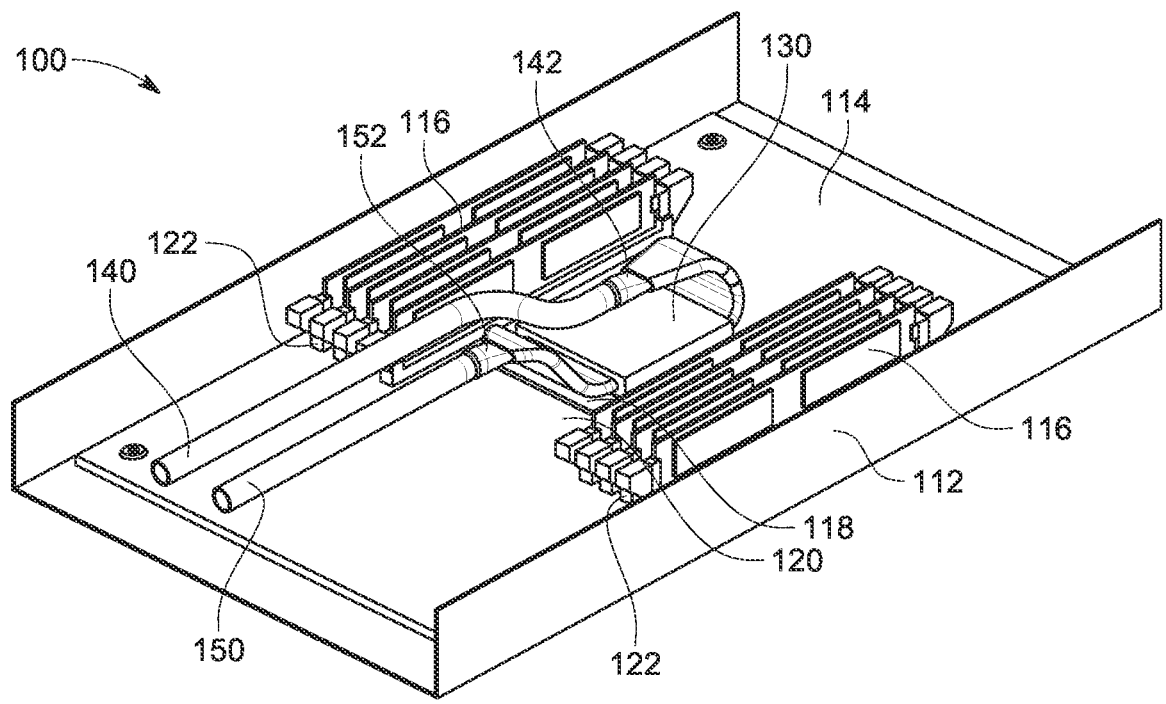
FIG. 2 is a perspective view of a cutaway of an example computer component with the example cold plate.

FIG. 2 is a perspective view of a computer component 100 such as a server having cold plates installed on heat-generating components. The server includes a chassis 112 that has a circuit board 114 mounting components such as dual in line memory modules (DIMMs) 116 and a processor chip 118. In this example, the processor chip 118 is mounted in a socket 120 that is fixed on the circuit board 114. The DIMMs 116 are mounted in sockets 122 on the circuit board 114 that are on opposite sides of the processor chip 118.

In this example, cold plates such as a cold plate 130 are mounted over heat-generating electrical components, such as the processor chip 118 to transfer heat away from the processor chip 118. A supply hose 140 is connected to a coupler 142 to supply coolant to the cold plate 130. The supply hose 140 has a generally circular cross-section. The coupler 142 has a generally circular cross section inlet end that is coupled to one end of the supply hose 140. An opposite outlet end from the circular inlet end of the coupler 142 has a generally rectangular cross section. The opposite outlet end of the coupler 142 is coupled to a streamlined supply tube of the cold plate 130 as will be explained in detail below. A collection hose 150 is connected to a coupler 152 to collect heated coolant from the cold plate 130. The collection hose 150 has a generally circular cross-section. The coupler 152 has a generally circular cross section outlet end that is coupled to one end of the collection hose 150. An opposite inlet end from the circular outlet end of the coupler 152 has a generally rectangular cross section. The opposite inlet end of the coupler 152 is coupled to a streamlined collection tube of the cold plate 130 as will be explained in detail below.

The cold plate 130 may be attached to the socket 120 so the cold plate 130 is in thermal contact with a heat-generating component such as a processor chip 118. In this example, the processor chip 118 may be part of a computer component such as a storage server, an application server, a network switch, or other electronic devices. In this example, the processor chip 118 is a central processing unit. However, the example cold plate 130 may be used to cool any heat-generating component such as a graphic processing unit (GPU), an application specific integrated circuit (ASIC), a field programmable gate array (FPGA), a programmable logic controller (PLC), and the like.

The computer component 100 is generally placed in a rack with a liquid cooling system having a cold coolant manifold and a hot coolant manifold. The chassis 112 encloses the electronics such as power supplies, circuit boards, device cards, processors, memory devices, and other elements of the computer component 100. In this example, the rear of the chassis 112 includes an inlet connector that may be connected to a fluid couplers of a cold coolant manifold in the rack. The rear of the chassis 112 also includes an outlet connector that may be connected to a fluid coupler of a hot coolant manifold of the rack. The fluid inlet and outlet connectors thus connect the coolant manifolds to the other ends of the hoses 140 and 150.

The liquid cooling system generally includes a heat exchanger that receives the hot coolant from hot coolant manifold. The heat exchanger generally includes a radiator that circulates the hot coolant. A fan wall provides cooling of the coolant in the radiator. The now cooled coolant is circulated by a pump of a coolant distribution unit to the cold coolant manifold.

Figure 3A:
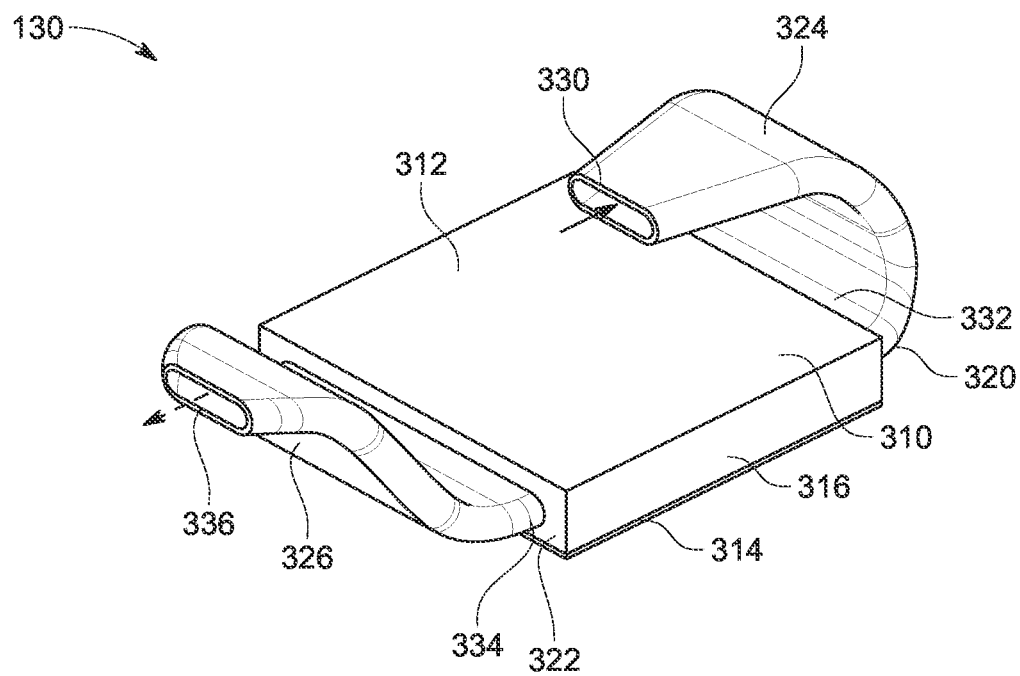
FIG. 3A is a perspective view of an example cold plate having streamlined inlet and outlet connectors, according to certain aspects of the present disclosure.
Figure 3B:
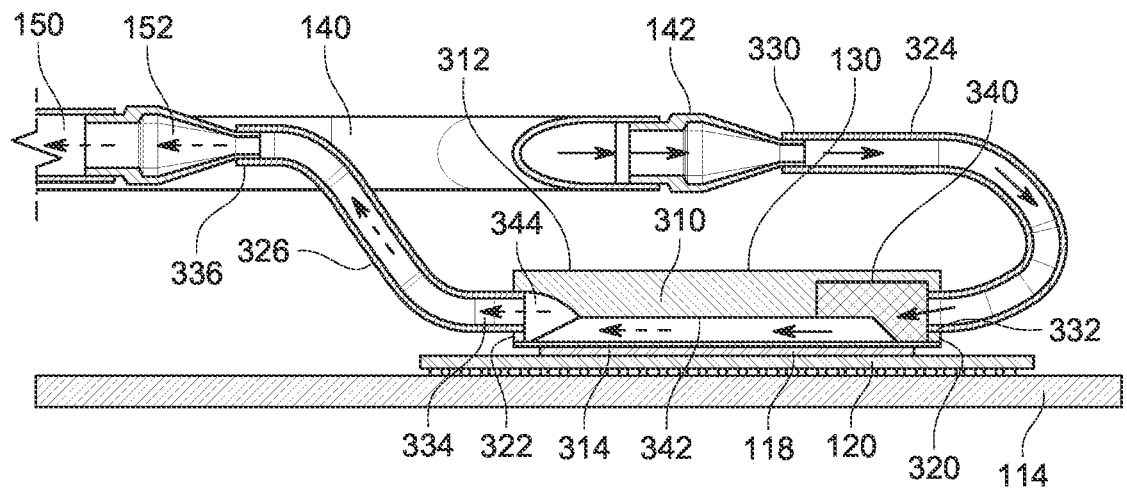
FIG. 3B is a side view of the example cold plate in FIG. 3A in the computer component in FIG. 2 showing coolant flow, according to certain aspects of the present disclosure.

FIG. 3A is a perspective view of the example cold plate 130. FIG. 3B is a cutaway side view of the cold plate 130 in FIG. 3A installed in the computer component 100 in FIG. 2. The cold plate 130 has a base member 310 and a lid member 312. The base member 310 and the lid member 312 are fabricated from heat conductive metal such as aluminum alloy, copper, copper alloy or stainless steel. In this example, the base member 310 and the lid member 312 are tooled separately from copper and soldered together. The base member 310 includes a flat bottom surface 314 that is placed in thermal contact with the heat-generating component such as the processor chip 118. Thermal paste may be applied to the bottom surface 314 to create better thermal flow between the bottom surface 314 and the processor chip 118. The surface area of the processor chip 118 may range from the almost the entire surface area of the bottom surface 314 of the base member 310 to some fraction of the entire area of the bottom surface 314 of the base member 310.

The base member 310 has a rectangular shape that includes a supply end 320 and an opposite collection end 322 that are joined by two sides 316. A supply tube 324 is fluidly coupled to the supply end 320. A collection tube 326 is fluidly coupled to the opposite collection end 322. As will be explained, the base member 310 includes internal channels defined by fins that serve to circulate the coolant that is supplied by the supply tube 324. Heat from the processor is transferred from the bottom surface 314 of the base member 310 to the coolant, which is collected by the collection tube 326 to carry away the heat from the processor.

In this example, the base member 310 and the lid member 312 is fabricated from copper. The two tubes 324 and 326 are fabricated from stainless steel. The supply tube 324 has an inlet 330 that may be fluidly connected to the supply hose 140 in FIG. 2. As will be explained the supply tube 324 has an outlet 332 that is fluidly connected to the supply end 320 of the base member 310. Correspondingly, an inlet 334 of the collection tube 326 is fluidly connected to the collection end 322 of the base member 310. The opposite end of the collection tube 326 has an outlet 336 that may be fluidly coupled to the collection hose 150 in FIG. 2.

As may be seen in FIG. 3B, coolant is fed from the supply hose 140 through the coupler 142 to the inlet 330 of the supply tube 324. The coolant flows through the supply tube 324 to the outlet 332 that is fluidly coupled to a supply interior chamber 340 formed by the supply end 320, the lid member 312 and the base member 310 of the cold plate 130. The coolant in the supply interior chamber 340 is forced through a series of parallel fins 342. The parallel fins 342 are on the opposite side of the contact bottom surface 314. Thus, the coolant flow through channels defined by the parallel fins 342 transfers heat on the contact bottom surface 314. The cold plate 130 is attached to the socket 120 such that the top surface of the processor chip 118 is in direct contact with the contact bottom surface 314 of the cold plate 130.

The heated coolant is collected in a collection interior chamber 344 that is defined by the supply end 320 and the base member 310 and the lid member 312. The collected coolant flows out of the collection interior chamber 344 to the inlet 334 of the collection tube 326. The coolant flows through the collection tube 326 to the outlet 336. The collected fluid then flows through the coupler 152 to the collection hose 150.

As will be explained the shape of the supply tube 324 prevents sudden pressure drops in the coolant flow by eliminating 90 degree bends that guide the coolant flow. Similarly, the shape of the collection tube 326 prevents sudden pressure drops in the coolant flow. In this manner, coolant flow is facilitated through the cold plate 130 by avoiding pressure drops.

Figure 4A:
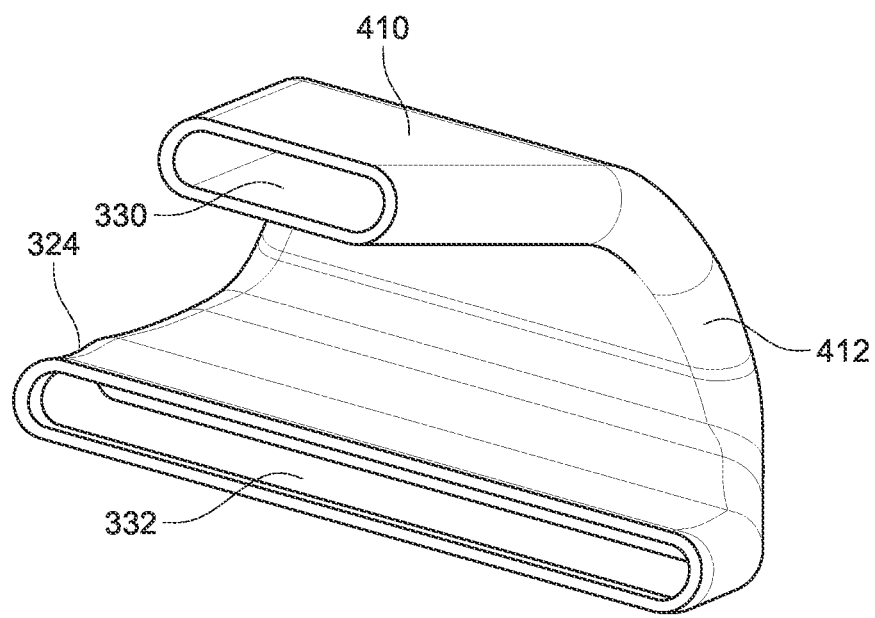
FIG. 4A is a side perspective view of an inlet streamlined tube of the example cold plate in FIG. 3A, according to certain aspects of the present disclosure.
Figure 4B:
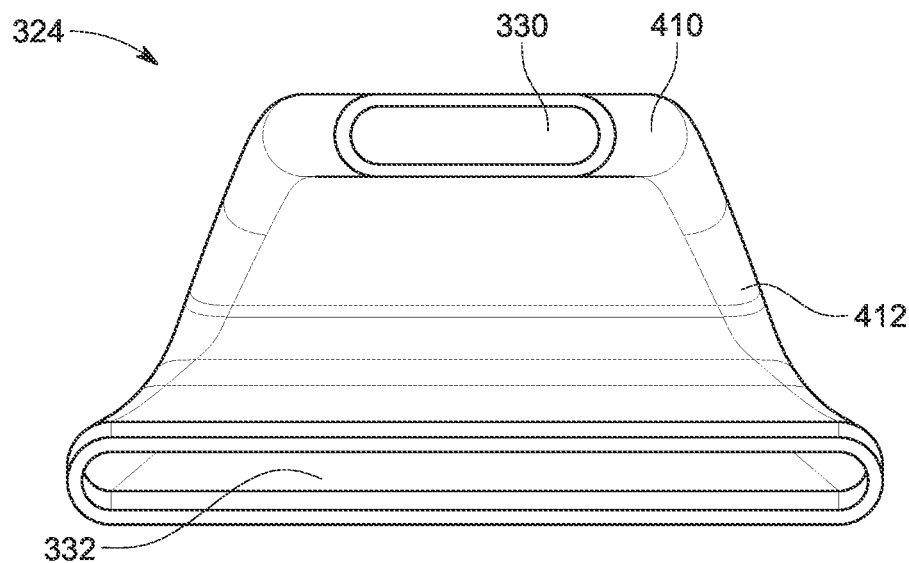
FIG. 4B is a front perspective view of the inlet streamlined tube of the example cold plate in FIG. 3A, according to certain aspects of the present disclosure.

FIGS. 4A-4B are perspective views of the supply tube 324. The supply tube 324 includes the inlet 330 that has a roughly rectangular cross section. The inlet 330 is defined by a trapezoidal section 410 that widens from the inlet 330. The supply tube 324 has a curved section 412 that is gradually curved. The interior of the curved section 412 does not have any sharp 90 degree turns but the curved section 412 directs the coolant in an approximately 180 degree direction to the supply end 320. The opposite end of the curved section 412 defines the outlet 332.

The outlet 332 has a larger rectangular cross section than the cross section of the inlet 330. The width of the outlet 332 is approximately the width of the base member 310. The length of the supply tube 324 as defined by the trapezoidal section 410 and the curved section 412 thus funnels the coolant from the relatively smaller cross section area of the inlet 330 to the larger outlet 332. The goal is to reduce system pressure drop through the streamlined interior shape of the supply tube 324. The interior cross section area between the inlet 330 and the outlet 332 gradually enlarges and does not have any sharp angles to effectively reduce system pressure drop in coolant flowing into the cold plate 130.

Figure 5A:
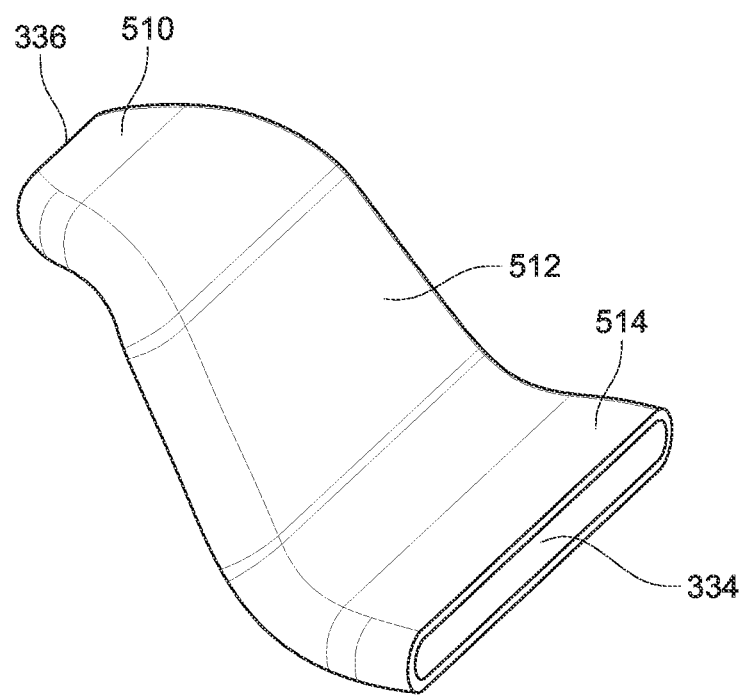
FIG. 5A is a side perspective view of an outlet streamlined tube of the example cold plate in FIG. 3A, according to certain aspects of the present disclosure.
Figure 5B:
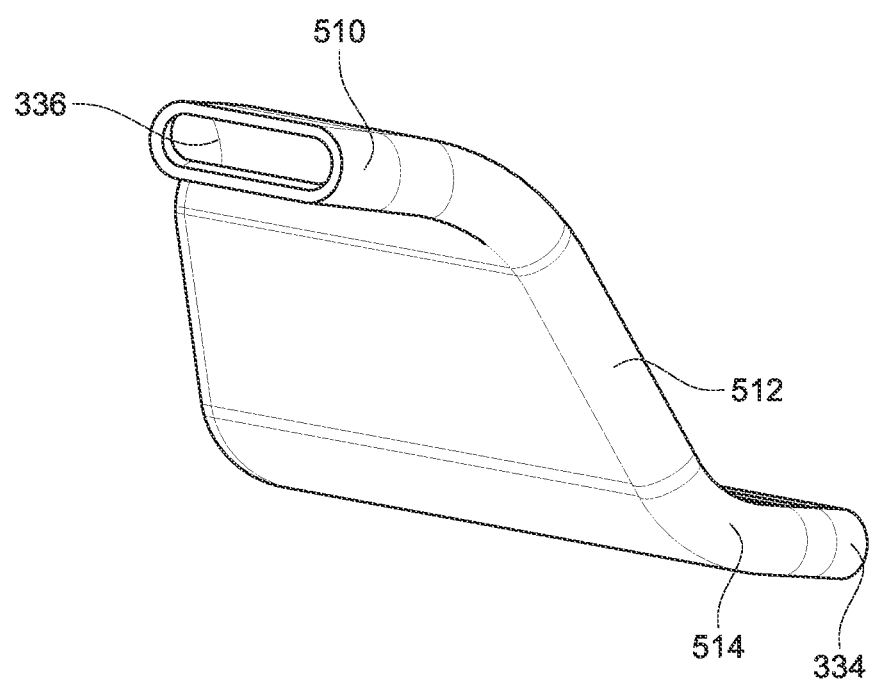
FIG. 5B is a front perspective view of the outlet streamlined tube of the example cold plate in FIG. 3A, according to certain aspects of the present disclosure.

FIGS. 5A-5B are perspective views of the collection tube 326. The collection tube 326 includes the outlet 336 that has a roughly rectangular cross section. The inlet 334 is defined by one end of a trapezoidal section 510 that widens from the outlet 336. The collection tube 326 has a transition section 512 that is gradually curved. The interior of the curved section 512 does not have any sharp 90 degree turns but the curved section 512 directs the coolant in an approximately 45 degree direction from the collection end 322 of the base member 310. The opposite end of the curved section 512 is coupled to a section 514 that defines the inlet 334. The inlet 334 has a larger rectangular cross section than the cross section of the outlet 336. The width of the inlet 334 is approximately the width of the base member 310. The length of the collection tube 326 as defined by the section 514, the curved section 512, and the trapezoidal section 510 funnels the coolant from the relatively larger cross section area of the inlet 334 to the smaller outlet 336. The goal is to reduce system pressure drop through the streamlined interior shape of the collection tube 326. The interior cross section between the inlet 334 and the outlet 336 is gradually reduced and does not have any sharp angles to effectively reduce system pressure drop in coolant flowing from the cold plate 130.

Both the supply tube 324 and collection tube 326 may be fabricated by any appropriate method such as 3D printing, metal injection molding, sheet pressing and stamping, and the like to produce the streamlined shape of the tubes.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure.

Thus, the breadth and scope of the present disclosure should not be limited by any of the above described embodiments. Rather, the scope of the disclosure should be defined in accordance with the following claims and their equivalents.

What is claimed is:

1. A cold plate for cooling a heat-generating component, the cold plate comprising:
    a base member having an exterior surface for contact with the heat-generating component, a supply chamber defined by a supply end, and an opposite collection chamber defined by a collection end;
    a supply tube including an inlet and an outlet, the inlet having a cross section area that is smaller than a cross section area of the outlet, and wherein the outlet is in fluid communication with the supply chamber, wherein the supply tube includes a curved section that directs fluid flow 180 degrees between the inlet of the supply tube and the outlet of the supply tube; and
    a collection tube including an inlet and an outlet, the inlet having a cross section area that is larger than a cross section area of the outlet, wherein the inlet is in fluid communication with the collection chamber.

2. The cold plate of claim 1, wherein the base member includes a plurality of coolant channels defined by a plurality of fins between the supply chamber and collection chamber.

3. The cold plate of claim 1, wherein the collection tube includes a curved surface that is angled relative to the inlet of the collection tube.

4. The cold plate of claim 1, wherein the base member is fabricated from one of a group of copper, copper alloy, stainless steel, and aluminum alloy.

5. The cold plate of claim 1, wherein the collection tube and the supply tube are fabricated from stainless steel.

6. The cold plate of claim 1, wherein the width of the inlet of the collection tube and the outlet of the supply tube are the width of the respective collection and supply ends of the base member.

7. The cold plate of claim 1, wherein the collection tube and the supply tube are manufactured by one of 3D printing, injection molding, sheet pressing, or sheet stamping.

8. A computer system comprising:
    a heat-generating computer component;
    a hot coolant connector;
    a cold coolant connector; and
    a cold plate including:
        a base member having an exterior surface in contact with the heat-generating component, a supply chamber defined by a supply end, and an opposite collection chamber defined by a collection end;
        a supply tube including an inlet and an outlet, the inlet having a cross section area that is smaller than a cross section area of the outlet, wherein the inlet is in fluid communication with the cold coolant connector and the outlet is in fluid communication with the supply chamber, wherein the supply tube includes a curved section that directs fluid flow 180 degrees between the inlet of the supply tube and the outlet of the supply tube; and
        a collection tube including an inlet and an outlet, the inlet having a cross section area that is larger than a cross section area of the outlet, wherein the inlet is in fluid communication with the collection chamber and wherein the outlet is in fluid communication with the hot coolant connector.

9. The computer system of claim 8, wherein the base member includes a plurality of coolant channels defined by a plurality of fins between the supply chamber and collection chamber.

10. The computer system of claim 8, wherein the collection tube includes a curved surface that is angled relative to the inlet of the collection tube.

11. The computer system of claim 8, wherein the base member is fabricated from one of a group of copper, copper alloy, stainless steel, and aluminum alloy.

12. The computer system of claim 8, wherein the collection tube and the supply tube are fabricated from stainless steel.

13. The computer system of claim 8, wherein the width of the inlet of the collection tube and the outlet of the supply tube are the width of the respective collection and supply ends of the base member.

14. The computer system of claim 8, further comprising:
    a supply hose having a circular cross section and a first end coupled to the cold coolant connector;
    a first coupler having an inlet with a circular cross section coupled to a second end of the supply hose and an outlet having a generally rectangular cross section coupled to the inlet of the supply tube;
    a collection hose having a circular cross section and a first end coupled to the hot coolant connector; and
    a second coupler having an outlet with a circular cross section coupled to a second end of the collection hose and an inlet having a generally rectangular cross section coupled to the outlet of the collection tube.

15. The computer system of claim 8, wherein the collection tube and the supply tube are manufactured by one of 3D printing, injection molding, sheet pressing, or sheet stamping.

16. The computer system of claim 8, wherein heat-generating computer component is a processor chip.

* * * * *